United States Patent
Ye et al.

(10) Patent No.: US 7,443,669 B2
(45) Date of Patent: Oct. 28, 2008

(54) HEAT DISSIPATING DEVICE FOR DATA STORAGE DEVICE

(75) Inventors: Zhen-Xing Ye, Shenzhen (CN); Ke Sun, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/778,664

(22) Filed: Jul. 17, 2007

(65) Prior Publication Data

US 2008/0151493 A1   Jun. 26, 2008

(30) Foreign Application Priority Data

Dec. 26, 2006   (CN) .................. 2006 1 0201412

(51) Int. Cl.
*H05K 7/20* (2006.01)
*G06F 1/16* (2006.01)
(52) U.S. Cl. .................. 361/688; 361/684; 361/685; 361/727; 361/831; 165/80.3; 165/104.33; 165/185; 248/225.11; 248/298.1
(58) Field of Classification Search .................. 361/679, 361/684–689, 702–712, 715–727, 800, 801, 361/831; 165/80.2, 80.3, 80.4, 104.33, 185; 248/225.11, 298.1, 638, 604, 917, 603, 568; 360/97.02; 29/505, 515, 516, 520, 437; 312/223.2, 312/223.3, 244

See application file for complete search history.

(56) References Cited

U.S. PATENT DOCUMENTS

| 6,185,097 | B1 * | 2/2001 | Behl ............................ 361/695 |
| 6,233,148 | B1 * | 5/2001 | Shen ........................... 361/695 |
| 6,396,689 | B1 * | 5/2002 | Yu et al. ...................... 361/687 |
| 6,657,858 | B2 * | 12/2003 | Rothschild ................... 361/685 |
| 6,731,501 | B1 * | 5/2004 | Cheng ......................... 361/685 |
| 6,867,963 | B2 * | 3/2005 | Staiano ....................... 361/685 |
| 7,054,153 | B2 * | 5/2006 | Lewis et al. ................. 361/685 |
| 7,167,368 | B2 * | 1/2007 | Ya ............................... 361/707 |

* cited by examiner

*Primary Examiner*—Michael V Datskovskiy
(74) *Attorney, Agent, or Firm*—Frank R. Niranjan

(57) ABSTRACT

A heat dissipating device for a data storage device includes a bracket configured for receiving the data storage device, a heat sink received in the bracket configured for dissipating heat from the data storage device, and a fastener. The bracket has two sidewalls. A slot is defined in each sidewall of the bracket. The fastener has two free ends fixed in the slots of the bracket respectively for pressing the heat sink to closely contact with the data storage device.

14 Claims, 3 Drawing Sheets

HEAT DISSIPATING DEVICE FOR DATA STORAGE DEVICE

BACKGROUND OF THE INVENTION

1. Field of the Invention

The present invention relates to a heat dissipating device for a data storage device.

2. Description of Related Art

During operation of an electronic device of a computer such as a data storage device, a large amount of heat is often produced. With the development of computer technology, the rotation speed of data storage devices becomes faster and faster. The heat must be quickly removed from the data storage devices to prevent damage to the electronic device due to overheating. Typically, a system fan is arranged in the enclosure of the computer for dissipating the heat from the data storage device.

However, dissipating heat only via the system fan is slow and inefficient.

Consequently, it is required to provide a heat dissipating device for a data storage device.

SUMMARY OF THE INVENTION

In one preferred embodiment, a heat dissipating device for a data storage device includes a bracket configured for receiving the data storage device, a heat sink received in the bracket configured for dissipating heat from the data storage device, and a fastener. The bracket has two sidewalls. A slot is defined in each sidewall of the bracket. The fastener has two free ends fixed in the slots of the bracket respectively for pressing the heat sink to closely contact with the data storage device.

Other advantages and novel features of the present invention will become more apparent from the following detailed description of preferred embodiment when taken in conjunction with the accompanying drawings, in which:

DETAILED DESCRIPTION OF THE INVENTION

Figure 1:
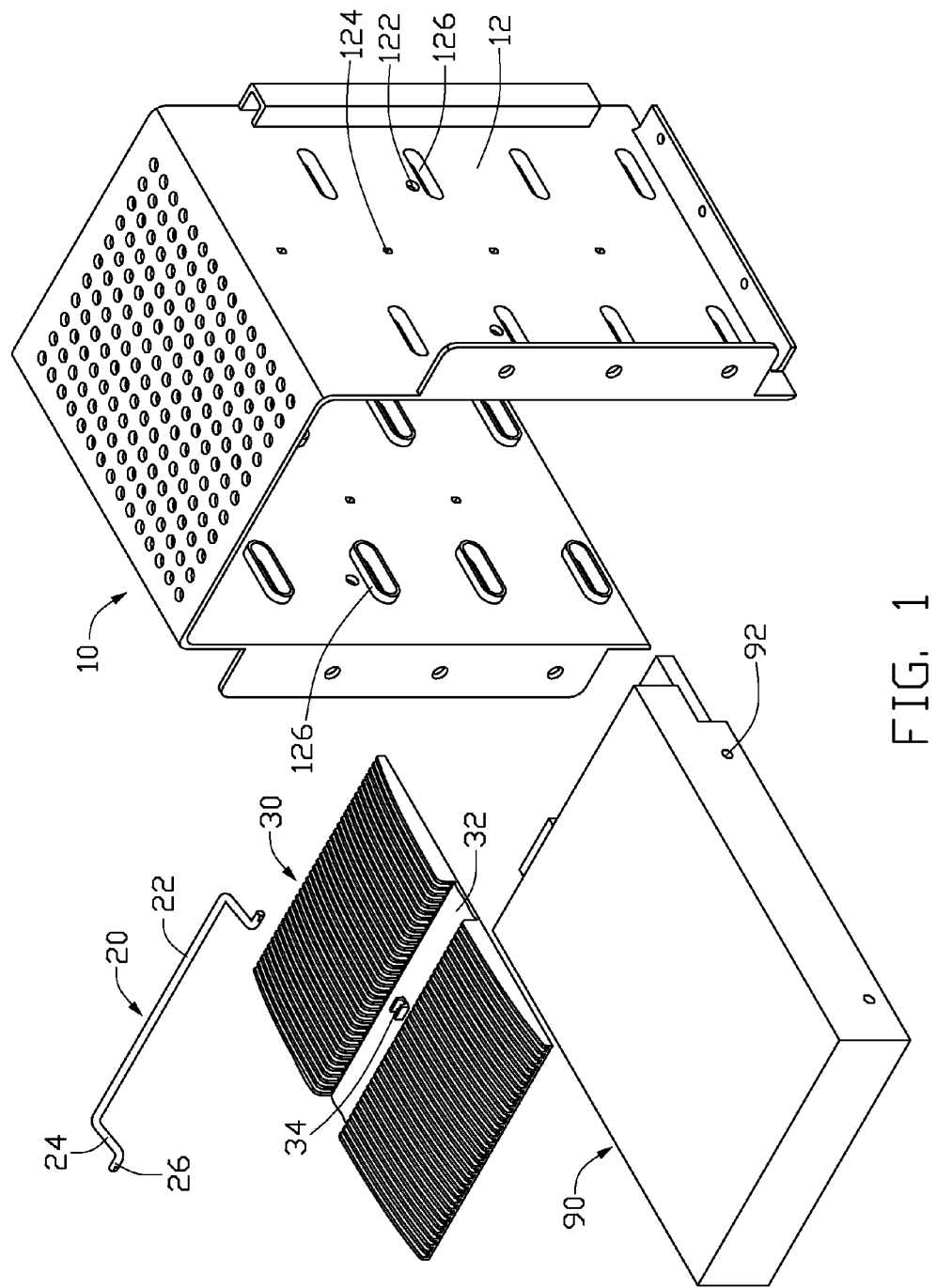
FIG. 1 is an exploded, isometric view of a heat dissipating device according to a preferred embodiment of the present invention together with a storage device.

Referring to FIG. 1, in an embodiment of the invention, a heat dissipating device is provided for dissipating heat for a data storage device 90, which includes a bracket 10, a fastener 20, and a heat sink 30. Two mounting holes 92 are defined in each sidewall of the data storage device 90.

The bracket 10 includes a top wall, and two side walls 12 extending down from opposite sides of the top wall respectively. Two through holes 122 are defined in each sidewall 12 corresponding to the mounting holes 92 of the data storage device 90. A rectangular slot 124 is defined in a middle portion of each sidewall 12. A supporting portion 126 extends inward from each sidewall 12 below each through hole 122.

In this embodiment, the fastener 20 is a resilient member and includes a mounting pole 22 in a middle thereof, two bent portions 24 bent perpendicularly from opposite ends of the mounting pole 22 respectively, and two connecting portions 26 extending in opposite directions from free ends of the bent portions 24 respectively and generally in parallel to the mounting pole 22. Each connecting portion 26 has a rectangular end.

The heat sink 30 includes a bottom plate 32, and a plurality of fins extending upward from the bottom plate 32 with a horizontal passage defined at a middle part of the heat sink 30. A generally U-shaped locking portion 34 is formed on a middle portion of the bottom plate 32 in the passage of the heat sink 30.

Figure 2:
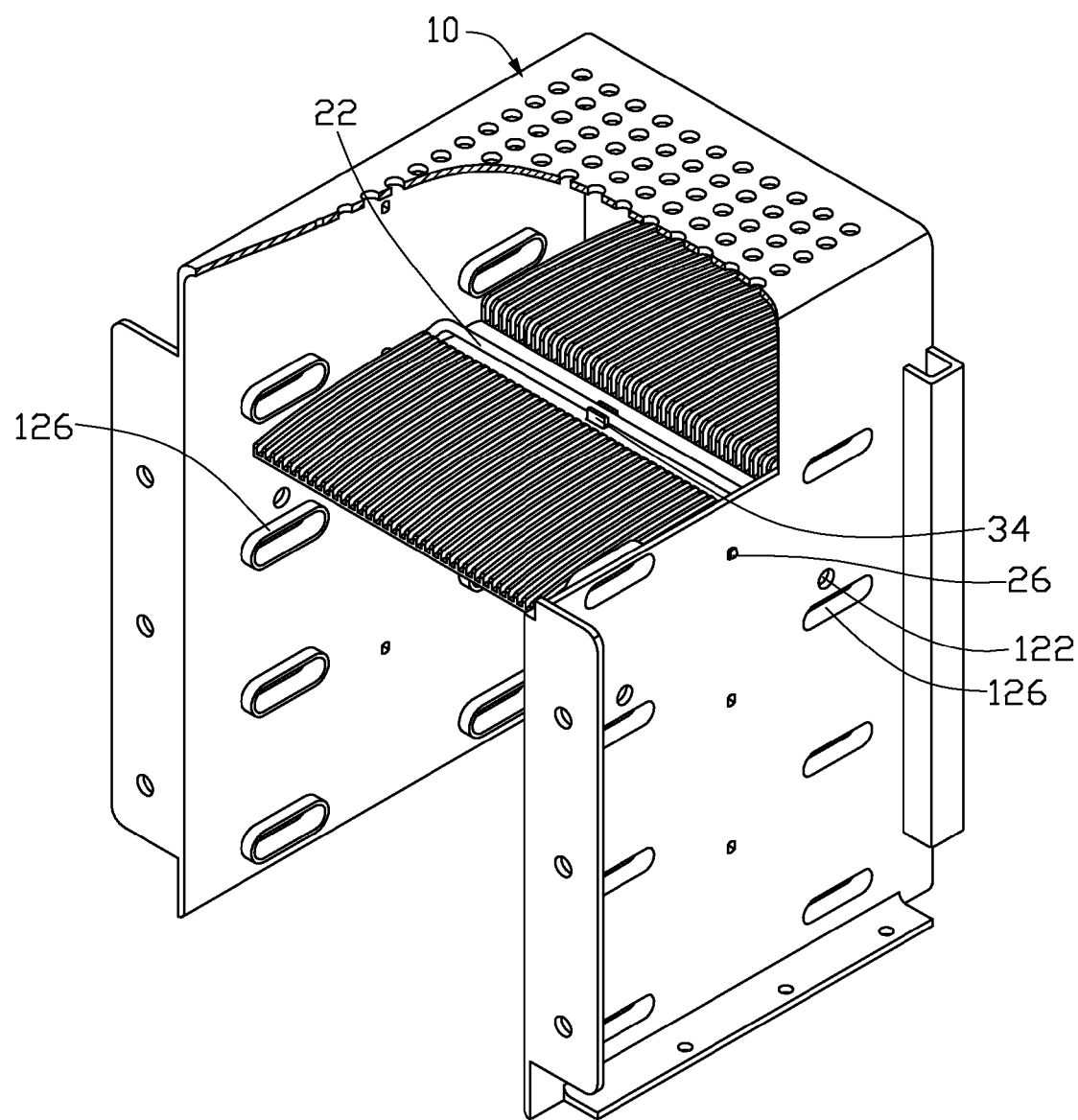
FIG. 2 is a partly assembled view of FIG. 1 without the storage device.

Referring also to FIG. 2, in assembly, the heat sink 30 is received in the bracket 10 and a middle portion of the mounting pole 22 is inteferentially received in the slot of the locking portion 34 for holding the heat sink 30 to the fastener 20 so that the fastener 20 can assemble the heat sink 30 to the bracket 10 before the data storage device 90 is inserted into the bracket. The connecting portions 26 are fittingly inserted in the corresponding slots 124 of the sidewalls 12 of the bracket 10 to assemble the heat sink 30 in the bracket 10. The fastener 20 can not rotate in the slots 124 of the sidewalls 12 of the bracket 10, the bent portions 24 of the fastener 20 is slantingly positioned relative to the top wall of the bracket 10, and the mounting pole 22 of the fastener 20 is located in a slantingly upper position relative to an axial line between the slots 124 of the sidewalls 12 of the bracket 10. At this position, the distance between the bottom surface of the bottom plate 32 of the heat sink 30 and a supporting face formed by the upper surfaces of the adjacent supporting portions 126 on which the data storage device 90 will be placed is slightly smaller than the depth of the data storage device 90.

Figure 3:
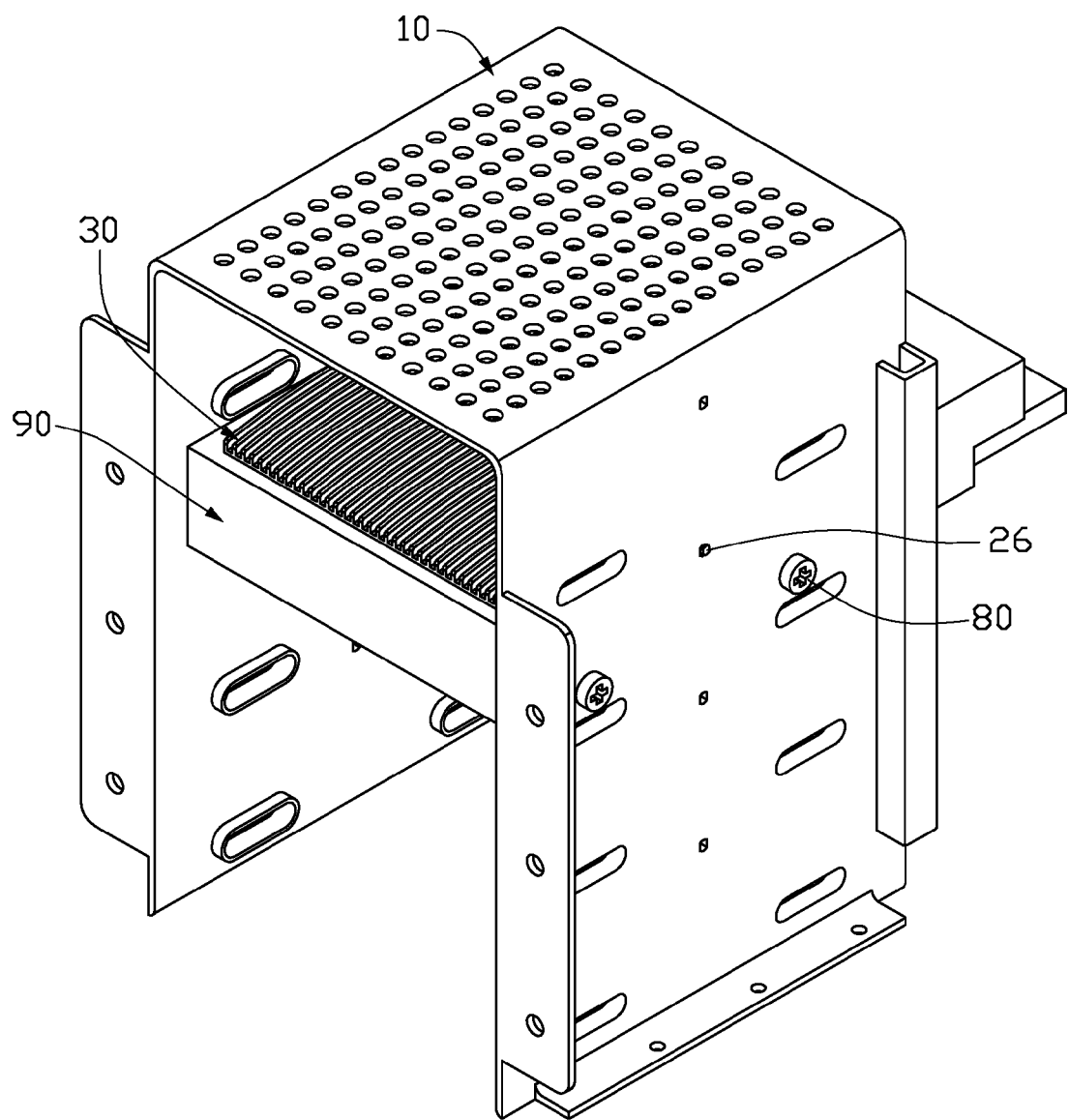
FIG. 3 is a fully assembled view of FIG. 1.

Referring also to FIG. 3, the data storage device 90 is pushed to slide into the bracket 10 along the supporting portions 126 with a top surface of the data storage device 90 pressing upwardly against the bottom surface of the bottom plate 32 of the heat sink 30. A plurality of rivets 80 extends through the through holes 122 of the bracket 10 and engages in the mounting holes 92 of the data storage device 90. Thus the data storage device 90 is mounted in the bracket 10. The fastener 20 is deformed to exert a force to press the heat sink 30 against the data storage device 90 to maintain the heat sink 30 closely contacting with the data storage device 90 for dissipating heat therefrom.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipating device for a data storage device comprising:
   a bracket configured for receiving the data storage device, the bracket comprising two sidewalls, a slot defined in each sidewall;
   a heat sink received in the bracket configured for dissipating heat from the data storage device; and
   a fastener having two free ends being fixed in the slots of the bracket respectively for pressing the heat sink to closely contact with the data storage device.

2. The heat dissipating device as described in claim 1, wherein the heat sink comprises a bottom plate for contacting the data storage device, and a plurality of fins extending from the bottom plate.

3. The heat dissipating device as described in claim 2, wherein a locking portion is formed on a middle portion of the bottom plate for engaging with the fastener.

4. The heat dissipating device as described in claim 3, wherein the locking portion is generally U-shaped.

5. The heat dissipating device as described in claim 1, wherein the free ends of the fastener and the corresponding slots of the bracket are respectively rectangular.

6. The heat dissipating device as described in claim 1, wherein a plurality of supporting portions extend inward from the sidewalls of the bracket for supporting the data storage device.

7. An assembly comprising:
   a data storage device;
   a bracket for receiving the data storage device, the bracket comprising two sidewalls;
   a heat sink received in the bracket and placed on the data storage device; and
   a resilient fastener which comprises two connecting portions detachably and unrotatably mounted to the sidewalls;
   wherein the heat sink is pressed firmly against the data storage device by the fastener.

8. The assembly as described in claim 7, wherein the data storage comprises two mounting holes defined in opposite side thereof respectively, the bracket defines two through holes corresponding to the mounting holes, two rivets extend through the through holes of the bracket and engage into the mounting holes of the data storage device respectively.

9. The assembly as described in claim 7, wherein the fastener further comprises a mounting pole extending through and pressing against the heat sink, two bent portions bent perpendicularly from two opposite ends of the mounting pole respectively, the two connecting portions extend in opposite directions from free ends of the bent portions respectively and are generally parallel to the mounting pole, two slots are defined in the sidewalls of the bracket for unrotatably and engagingly receiving the connecting portions of the fastener.

10. The assembly as described in claim 9, wherein the two bent portions of the fastener are slantingly positioned relative to the bottom surface of the heat sink contacting with the data storage device.

11. The assembly as described in claim 10, wherein the mounting pole of the fastener is located in a slantingly upper position relative to an axial line between the slots of the sidewalls of the bracket.

12. The assembly as described in claim 9, wherein the connecting portions of the fastener and the corresponding slots of the bracket are respectively rectangular.

13. The assembly as described in claim 9, wherein the sidewalls of the bracket form a pair of supporting portions to form a supporting face for supporting the data storage device thereon, a distance between the bottom surface of the heat sink and a supporting face is slightly smaller than the depth of the data storage device.

14. The assembly as described in claim 9, wherein the heat sink comprises a bottom plate and a plurality of parallel fins extending upward from the bottom plate, a U-shaped locking portion is formed on the bottom plate for engagingly receiving the mounting pole of the fastener therein.

\* \* \* \* \*